(12) United States Patent
Zhang

(10) Patent No.: US 9,970,628 B2
(45) Date of Patent: May 15, 2018

(54) LED UNIT MODULE, LIGHT-EMITTING DEVICE, AND LIGHT SOURCE SYSTEM

(71) Applicant: APPOTRONICS CHINA CORPORATION, Shenzhen (CN)

(72) Inventor: Quan Zhang, Shenzhen (CN)

( * ) Notice: Subject to any disclaimer, the term of this patent is extended or adjusted under 35 U.S.C. 154(b) by 0 days. days.

(21) Appl. No.: 14/781,531

(22) PCT Filed: Apr. 11, 2014

(86) PCT No.: PCT/CN2014/075153
§ 371 (c)(1),
(2) Date: Sep. 30, 2015

(87) PCT Pub. No.: WO2014/166417
PCT Pub. Date: Oct. 16, 2014

(65) Prior Publication Data
US 2016/0040854 A1 Feb. 11, 2016

(30) Foreign Application Priority Data
Apr. 11, 2013 (CN) .................... 2013 2 0180806 U

(51) Int. Cl.
*F21V 5/04* (2006.01)
*H01L 25/13* (2006.01)
(Continued)

(52) U.S. Cl.
CPC ............... *F21V 5/04* (2013.01); *F21V 13/02* (2013.01); *F21V 14/06* (2013.01);
(Continued)

(58) Field of Classification Search
CPC .......... F21V 5/04; H01L 25/0753; H01L 25/13
See application file for complete search history.

(56) References Cited

U.S. PATENT DOCUMENTS 8,247,959 B2 8/2012 Beers et al.
8,262,252 B2 9/2012 Bergman et al.
(Continued)

FOREIGN PATENT DOCUMENTS

| CN | 101258426 A | 9/2008 |
| CN | 101630678 A | 1/2010 |

(Continued)

OTHER PUBLICATIONS

International Search Report in the parent PCT application No. PCT/CN2014/075153, dated Jul. 1, 2014.
(Continued)

*Primary Examiner* — Elmito Breval
(74) *Attorney, Agent, or Firm* — Chen Yoshimura LLP

(57) ABSTRACT

An LED unit module, a light-emitting device, and a light source system. The LED unit module comprises a substrate and an LED chipset arranged on the substrate. The LED chipset comprises at least five LED chips, where the LED chips are in a tight arrangement with each other, and the contour of a light-emitting side of the LED chipset is close to a regular hexagon. The LED chipset comprises LED chips of at least four colors, where the four colors are red, blue, green, and amber. The LED unit module allows for prevention of increased etendue and for uniform mixing of lights.

15 Claims, 5 Drawing Sheets

(51) Int. Cl.
- *H01L 25/075* (2006.01)
- *H01L 33/62* (2010.01)
- *F21V 13/02* (2006.01)
- *F21V 14/06* (2006.01)
- *F21Y 105/12* (2016.01)
- *F21Y 105/10* (2016.01)

(52) U.S. Cl.
CPC .......... *H01L 25/0753* (2013.01); *H01L 25/13* (2013.01); *H01L 33/62* (2013.01); *F21Y 2105/10* (2016.08); *F21Y 2105/12* (2016.08); *H01L 2924/0002* (2013.01)

(56) References Cited

U.S. PATENT DOCUMENTS

| | | |
|---|---|---|
| 8,613,530 B2 | 12/2013 | Allen et al. |
| 8,622,573 B2 | 1/2014 | Kubis et al. |
| 2004/0218387 A1 | 11/2004 | Gerlach |
| 2006/0007538 A1 | 1/2006 | Robinson |
| 2009/0046453 A1 | 2/2009 | Kramer |
| 2009/0103296 A1 | 4/2009 | Harbers et al. |
| 2009/0122530 A1 | 5/2009 | Beers et al. |
| 2010/0061090 A1 | 3/2010 | Bergman et al. |
| 2010/0103663 A1 | 4/2010 | Kubis et al. |
| 2010/0258819 A1 | 10/2010 | Marfeld et al. |
| 2011/0170289 A1 | 7/2011 | Allen et al. |
| 2012/0106151 A1 | 5/2012 | Vissenberg |
| 2012/0153852 A1* | 6/2012 | Zhang ............... F21V 5/008 315/192 |
| 2013/0155671 A1* | 6/2013 | Kurt ............... F21K 9/00 362/231 |
| 2015/0109773 A1 | 4/2015 | Li et al. |

FOREIGN PATENT DOCUMENTS

| | | |
|---|---|---|
| CN | 201487708 U | 5/2010 |
| CN | 102216673 A | 10/2011 |
| CN | 102272510 A | 12/2011 |
| CN | 102375315 A | 3/2012 |
| CN | 102518964 A | 6/2012 |
| CN | 102859257 A | 1/2013 |
| CN | 203258423 U | 10/2013 |
| EP | 1462711 A1 | 9/2004 |
| JP | 2003-204081 | 7/2003 |
| JP | 2007-012764 | 1/2007 |
| JP | 2008-506155 | 2/2008 |
| JP | 2008-541361 | 11/2008 |
| JP | 2012-256908 | 12/2012 |
| JP | 2012-531700 | 12/2012 |
| WO | 2011/004019 A1 | 1/2011 |
| WO | 2011/1085146 | 7/2011 |
| WO | 2011/117815 A1 | 9/2011 |
| WO | 2012032455 A1 | 3/2012 |
| WO | 2012/135504 | 10/2012 |

OTHER PUBLICATIONS

IPRP in the parent PCT application No. PCT/CN2014/075153, dated Oct. 13, 2015.

Supplementary European Search Report and Written Opinion, dated Oct. 12, 2016, in a counterpart EP application, No. EP 14782224.1.

Japanese Office Action, dated Jul. 5, 2016 in a counterpart Japanese patent application, No. JP 2016-506773.

* cited by examiner

LED UNIT MODULE, LIGHT-EMITTING DEVICE, AND LIGHT SOURCE SYSTEM

BACKGROUND OF THE INVENTION

Field of the Invention

This invention relates to display and illumination fields, and in particular, it relates to an LED (light emitting diode) unit module, light emitting device, and light source system.

Description of Related Art

Conventional high power illumination devices and lighting apparatus typically uses metal halide discharge lamps as the light sources. Because metal halide discharge lamps are white light sources, when color lights are required, various filter plates are placed in front of the metal halide discharge lamps to generate various color output lights. This type of light sources have the disadvantage that the life of metal halide discharge lamps is low, typically from a few hundred to a few thousand hours; also, color lights generated by filter plates have low color saturation and does not give bright colors, and the colors are not rich.

High power light emitting diodes (LED) has the advantages of safe, non-polluting, and long life, and hence have gradually become the first choice in light illumination applications. Their lives can be as long as a hundred thousand hours. Currently, high power LED as stage lighting sources have been realized; they have the advantages of long life, safe and non-polluting, and high color saturation. However, current single LED chips are limited in their light flux; to achieve high brightness color light, typically multiple LED chips of different colors are arrayed to generate high brightness output light.

A commonly used design uses dichroic plates to achieve wavelength-based combination of light generated by red (R), green (G) and blue (B) primary color LED arrays. However, because the spectra of different color lights may partially overlap, and because the transmission curve of the filter plates often cannot be made sufficiently steep due to limitations in fabrication process and cost, wavelength-based light combination can cause light loss due to filtering in the overlapped spectral regions. In particular, when supplemental LED of certain colors are added into the light source system to improve color rendering index, dichroic filters may filter out some important spectral ranges, resulting in relatively large light loss and lower color rendering index of the system.

To solve this problem, another commonly used design is to arrange LED chips of red (R), green (G), blue (B) and white (W) colors in an interleaved pattern to form an array, as shown in FIG. 1. FIG. 1 schematically illustrates an LED array in a conventional technology. This design uses geometry-based light combination to avoid loss of light in certain spectral ranges. However, in this design, because each LED chip requires a corresponding collimating device, the LED chips of different colors are separated from each other by a distance. The different spatial positions cause the output light beams of different colors to have different spatial distributions. Even after light mixing by downstream optical components, the projected light spots still have the problem of non-uniform distribution at positions off of the focal plane.

SUMMARY

Accordingly, the present invention is directed to an LED unit module that prevents the problem of increased etendue and can achieve uniform light mixing.

The present invention provides an LED unit module, which includes: a substrate and an LED chipset disposed on the substrate, wherein the LED chipset includes at least five LED chips that are arranged close to each other, and wherein a light emitting surface of the LED chipset has an outline shape that is substantially an equal-sided hexagon;

wherein the LED chipset includes LED chips of at least four colors, the four colors being red, blue, green and amber.

Preferably, the LED chipset further includes an LED of at least one color selected from cyan, deep blue, orange and white/yellow.

Preferably, the LED chipset includes four white/yellow LEDs, two red LEDs, two amber LEDs, one blue LED, one deep blue LED, one green LED and one cyan LED.

Preferably, same color LEDs are disposed symmetrically with respect to the center of the equal-sided hexagon, the blue LED and the deep blue LED are disposed symmetrically with respect to the center of the equal-sided hexagon, and the green LED and the cyan LED are disposed symmetrically with respect to the center of the equal-sided hexagon.

Preferably, the four white/yellow LEDs are arranged close to each other forming a rectangular array, and the remaining eight LEDs surround the rectangular array, where each two LEDs are disposed in parallel and close to two white/yellow LEDs on each side of the rectangular array.

Preferably, the LED chipset includes twelve LED chips, four of which are arranged close to each other forming a rectangular array, and the remaining eight LEDs surround the rectangular array, where each two LEDs are disposed in parallel and close to two LEDs on each side of the rectangular array.

Preferably, each color LED chip includes an anode connector and a cathode connector; the anode connectors of all LED chips are arranged along a first side of the substrate forming an anode connector set, and the cathode connectors of all LED chips are arranged along a second side of the substrate forming a cathode connector set.

Among the eight surrounding LEDs of the LED unit module, in each of the two rows of LED chips that are respectively closest to the first and second sides of the substrate, the two LED chips in the row are separated by a predetermined separation space, where wirings that connect the LED chips in the rectangular array with the corresponding anode connectors and cathode connectors are located on the surface of the substrate within the separation space.

Preferably, each of the two rows of LED chips includes a red LED and an amber LED.

In another aspect, the invention provides a light emitting device, which includes an array of a plurality of the above described LED unit modules.

Preferably, the array of LED unit modules form at least one concentric circle, wherein within each circle, in the counter-clockwise direction, rotation angles of the LED unit modules form an arithmetic series, and the common difference of the arithmetic series has an absolute value of 60 degrees.

In another aspect, the present invention provides a light source system, which includes:

the above described light emitting device;

a collimating unit array, wherein each collimating unit in the collimating unit array corresponds to an LED unit module of the array of LED unit modules, for collimating the light emitted by the corresponding LED unit module;

a fly-eye lens pair, including two fly-eye lenses, for homogenizing the light from the collimating unit array, wherein each microlens of the fly-eye lens disposed farther away from the collimating unit array is an equal-sided hexagon;

a focusing lens, for concentrating the light from the fly-eye lens pair onto a predetermined plane.

Preferably, the collimating unit array is an array of collimating lenses, each collimating lens being an equal-sided hexagon, where the collimating lenses are disposed close to each other and joined to each other.

Compared to conventional technologies, embodiments of the present invention have the following advantages:

Because the LED chipset including at least five LED chips and four colors are disposed on the same substrate, the downstream optics can provide one collimating unit for each LED chipset; because the light from LEDs has a Lambertian distribution, the multiple color lights from one LED chipset is collimated by the collimating unit into a parallel light beam and at the same time mixed into a uniform light beam. The different color lights in the parallel light beam spatially overlap with each other, and have similar corresponding angular distributions; this improves the uniformity of the light generated by the light source. Moreover, the light emitting surface of LED chipset in the LED unit module has an outline shape close to an equal-sided hexagon, which matches the equal-sided hexagon shape of the lens units of the second fly-eye lens of the fly-eye lens pair in the downstream optical path. This prevents etendue increase of the light outputted by the second fly-eye lens.

DETAILED DESCRIPTION OF PREFERRED EMBODIMENTS

For convenience, the descriptions here use terms such as up, down, left, and right to describe the spatial relationship of various components; it should be understood that these terms refer to the various direction in the figures.

Embodiments of the present invention are described below with reference to the drawings.

First Embodiment

Figure 1:
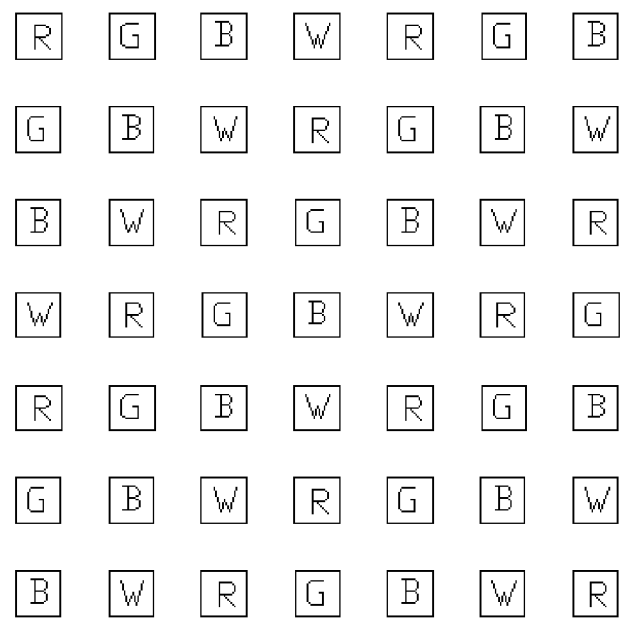
FIG. 1 schematically illustrates the structure of a convention LED array.
Figure 2:
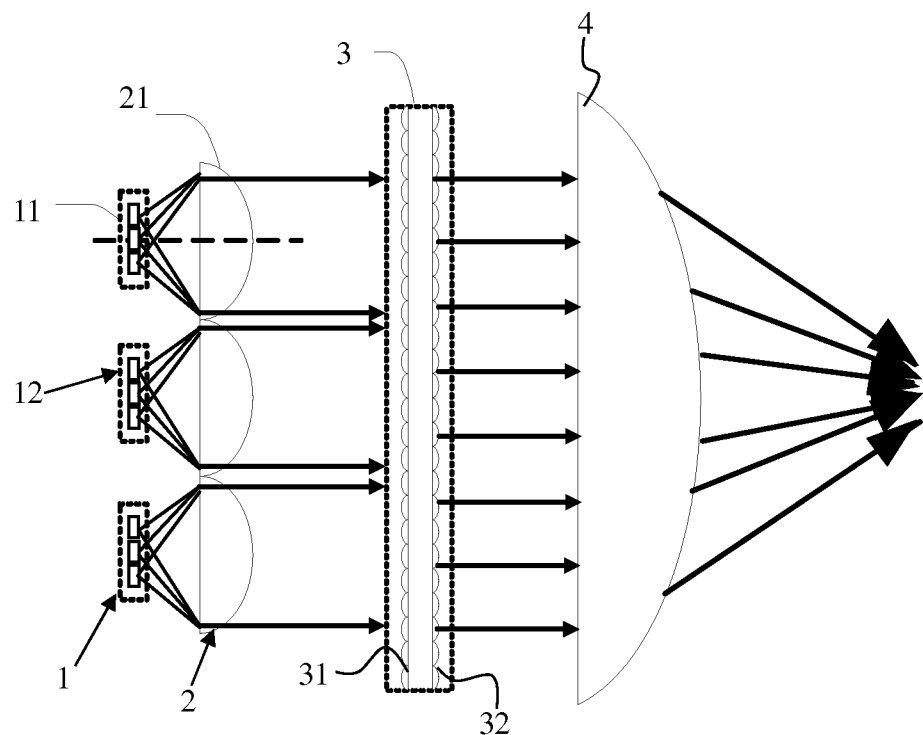
FIG. 2 schematically illustrates the structure of a light source system according to an embodiment of the present invention.

Refer to FIG. 2, which schematically illustrates the structure of a light source system according to an embodiment of the present invention. The light source system includes a light emitting device 1, a collimating device array 2, a fly-eye lens pair 3 and a focusing lens 4.

Figure 3:
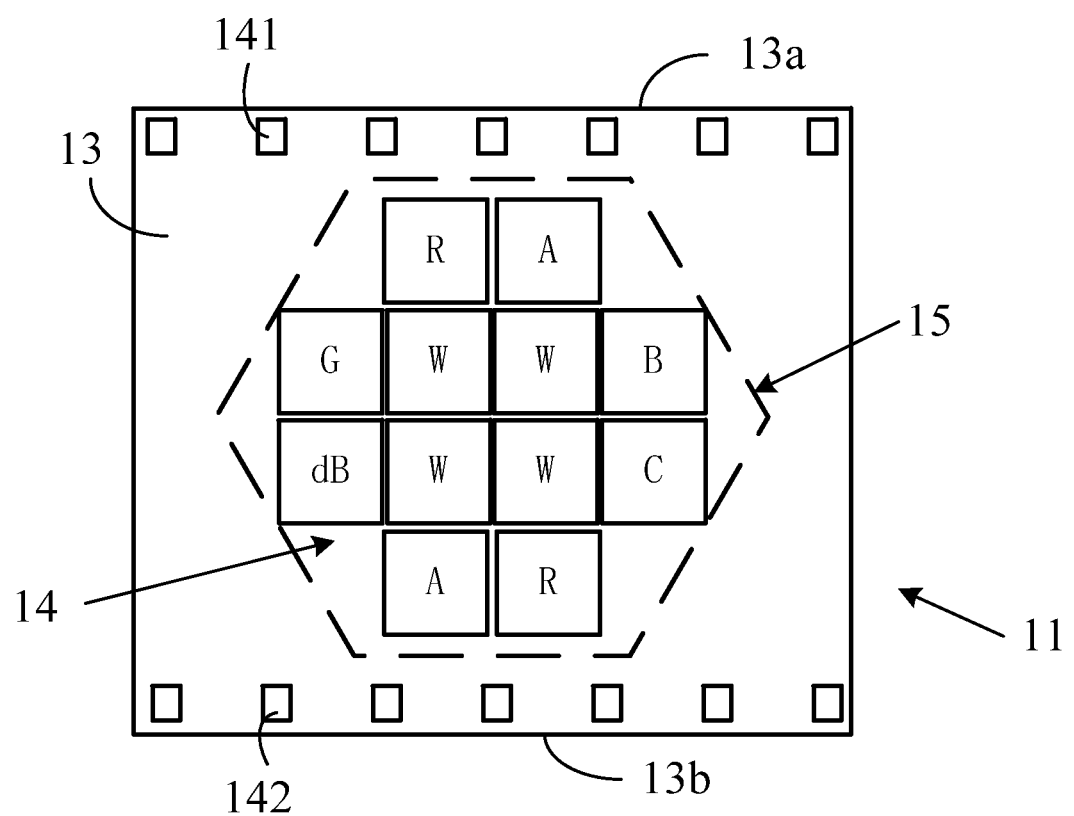
FIG. 3 schematically illustrates the structure of an LED unit module in the light source system of FIG. 2.

The light emitting device 1 includes multiple LED unit modules 11 forming an LED unit module array 12. Refer to FIG. 3, which schematically illustrates the structure of an LED unit module 11 in the light source system of FIG. 2. The LED unit module 11 includes a substrate 13 and a LED chipset 14 disposed on the substrate 13. In this embodiment, the substrate 13 is preferably a heat conducting substrate, which can be made of aluminum oxide, aluminum nitride or other heat conducting ceramics, as long as it has sufficiently high thermal conductivity and an insulating surface.

The LED chipset 14 includes twelve LED chips that are arranged close to each other, and the light emitting surface of the LED chipset 14 has an outline shape close to an equal-sided hexagon 15.

The purposes of making the LED chips close to each other are to reduce the etendue of the light source system and to reduce the spaces between LED chips as much as possible, which improve the uniformity of the light spot generated by the light source system. In practice, due to limitations in LED packaging techniques, the distances between LED chips often cannot be zero; rather, they are a small distance such as 0.1 to 0.2 mm (while the LED chips are about 1 mm in size) away from each other.

It should be noted that in practice, the LED chips typically have a square shape, so an LED chipset formed of multiple LED chips typically cannot have a light emitting surface with an outline shape of an equal-sided hexagon. In the present embodiment, the outline shape of the light emitting surface is said to be close to an equal-sided hexagon in the sense that the size of the area where the outline shape of the light emitting surface extends beyond the equal-sided hexagon, as well as the size of the area of the equal-sided hexagon that is not filled by the outline shape of the light emitting surface, are both less than 30% of the area of the outline shape of the light emitting surface. Here, the outline shape of the light emitting surface includes the spacing between adjacent LED chips.

The LED chipset 14 includes LED chips of seven colors, the LED chips of each color include at least one anode connector and one cathode connector. The LED chips are disposed on the substrate 13, and the anode connectors of all the LED chips are arranged along a first side 13a of the substrate 13 to form an anode connector set 141, and the cathode connectors of all the LED chips are arranged along a second side 13b opposite the first side 13a to form a cathode connector set 142. Of course, in practical applications, the anode and cathode connectors of the LED chips can use different arrangements.

Specifically, in this embodiment, the LED chipset 14 includes twelve LED chips, including four white LEDs (W in the drawing figure), two red LED (R in the drawing figure), two amber LED (A in the drawing figure), one blue LED (B in the drawing figure), one deep blue LED (dB in the drawing figure), one green LED (G in the drawing figure), and one cyan LED (C in the drawing figure). The dominant wavelength of the red LEDs is between 720 nm and 770 nm; the dominant wavelength of the amber LEDs is between 580 nm and 600 nm; the dominant wavelength of the green LED is between 520 nm and 550 nm; the dominant wavelength of the cyan LED is between 490 nm and 520 nm; the dominant wavelength of the blue LED is between 460 nm and 490 nm; and the dominant wavelength of the deep blue LED is between 440 nm and 460 nm.

Four LEDs are arranged close to each other forming the inner rectangular array. The remaining eight LED chips surround the inner rectangular array, each two LED chips being parallel and closely adjacent to two LED chips on one side of the inner rectangular array, forming an outer rectangular array. As a result, the light emitting surface of the LED chipset 14 has an outline shape close to an equal-sided hexagon 15.

Preferably, same colored LEDs are arranged symmetrically with respect to the center of the equal-sided hexagon 15. Because the blue LED and the deep blue LED have a relatively small color difference, and the green LED and the cyan LED have a relatively small color difference, the blue LED and the deep blue LED are symmetrical with respect to the center of the equal-sided hexagon 15, and the green LED and the cyan LED are symmetrical with respect to the center of the equal-sided hexagon 15.

Because the white LEDs are obtained by providing a yellow phosphor layer over the light emitting surface of blue LEDs, compared to other colored LEDs, white LEDs have better temperature resistance; because heat dissipation is the most difficult for the four LEDs at the center, white LEDs are preferably used as the four LED chips at the center, while other colored LEDs are arranged around the white LEDs. Further, by using four white LED chips, the brightness of the light emitting device can be significantly improved. Because red and amber LEDs have poorer thermal stability, these two colored LEDs are preferably arranged on the outside circle of the LED chipset.

Of course, in practical applications, the various colored LEDs can be arranged in other locations. For example, the four LEDs in the inner rectangular array may be blue, green, deep blue, and cyan LEDs arranged in clockwise direction, and in the eight LEDs forming the outer rectangular array, four white LEDs may be arranged on the four sides of the outer rectangular array and are symmetrical with respect to the equal-sided hexagon 15. Of course, if heat dissipation and light uniformity are not concerns, the various colored LEDs can be arranged in any spatial arrangement.

In this embodiment, the white LEDs in the LED chipset, which are used to increase brightness, can be replaced with yellow LEDs which have a dominant wavelength between 540 and 570 nm and have a spectral width wider than all other colored LEDs except the white ones. Other numbers of colors may be used in the LED chipset. For example, in applications that does not have a high requirement for color rendering index, the LED chipset may include only five colors including red, green, blue, white/yellow and amber. Specifically, such an LED chipset may include four white/yellow LEDs and two of each of the other color LEDs. In applications that does not have a high requirement for brightness, the LED chipset may include only four colors including red, green, blue, and amber. The spectrum of the combined light of these four colored LEDs is very close to the solar spectrum and has relatively high color rendering index to meet the requirements of most application. The number of LEDs of each color can be determined based on the required color temperature of the light source. Or, in addition to red, green, blue and amber, other colors may be added based on need; for example, cyan LEDs may be added if more cyan color is needed, deep blue LEDs may be added if more deep blue color is needed, and orange LEDs may be added if more orange color is needed, where the orange colored LED has a dominant wavelength between 710 and 720 nm.

In this embodiment, the number of LED chips in the LED chipset may be other numbers, as long as the multiple LED chips can be closely arranged and the light emitting surface of the LED chipset can have an outline shape close to an equal-sided hexagon. For example, the LED chipset may include five LED chips, with one LED chip located at the center and the remaining four LED chips located at the four sides of the center LED chip. Or, the LED chipset may include seven LED chips, with one LED chip located at the center and the remaining six LED chips surround the center LED chip in a circle. Or, the LED chipset may include twenty-one LED chips, with fifteen LED chips located at the center in a 3×5 rectangular array, and the remaining six LED chips located adjacent the two long sides of the rectangular array, three on each side. Because patterns formed by fewer than five LED chips cannot be close to an equal-sided hexagon, the LED chipset in the present embodiments includes at least five LED chips.

Figure 4:
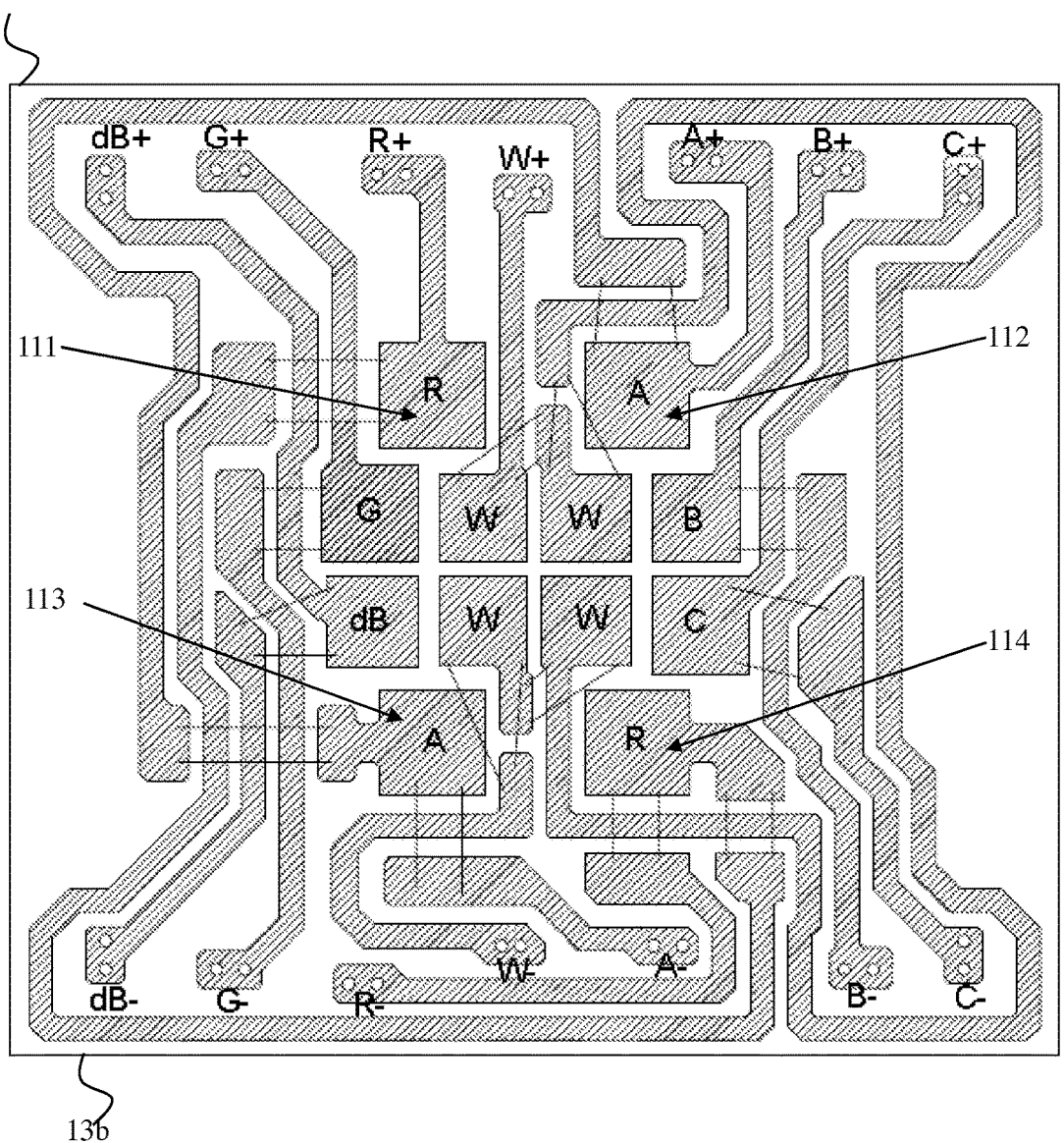
FIG. 4 schematically illustrates a wiring pattern in the LED unit module of FIG. 3.

Refer to FIG. 4, which schematically illustrates a wiring pattern in the LED unit module of FIG. 3. Along the first side 13a of the substrate 13, the anode connectors, one each for deep blue, green, red, white, amber, blue, and cyan, are arranged; along the second side 13b of the substrate 13, the cathode connectors, one each for deep blue, green, red, white, amber, blue, and cyan, are arranged. The same colored LEDs are coupled together in series on the substrate 13 (for example, the two red LEDs, the two amber LEDs, and the four white LEDs), so that for each color, only one anode connector and one cathode connector along the respective first and second sides 13a, 13b are required. This helps to make the LED unit module more compact and the size of the substrate 13 smaller.

Of course, in practical applications, the same colored LEDs can also be coupled together in parallel on the substrate 13, or some same colored LEDs can be coupled in series and some same colored LEDs can be coupled in parallel. Moreover, if the size of the LED unit module is not a concern, each LED chip may have its own anode and cathode connectors along the two sides of the substrate.

In this embodiment, for convenience of wiring, in the two rows of chips closest to the first side 13a and second side 13b of the substrate 13 respectively (e.g. LED chips 111 and 112, LED chips 113 and 114), the two LED chips in the row are slightly spaced apart from each other, so that the wires for the four white LEDs located in the center of the equal-sided hexagon can run on the surface of the substrate 13 in that space to reach the anode and cathode connectors along the first and second sides 13a and 13b. In this design, in the entire LED chipset, these four chips are spaced apart more from neighboring chips, which helps heat dissipation; so preferably these four chips are red LEDs and amber LEDs.

Of course, in practical applications, the anode and cathode of the LEDs in the inner region do not have to be connected to the anode and cathode connectors on the first and second sides 13a and 13b along the surface of the substrate 13; rather, they can be connected to the anode and cathode connectors using jumpers. For such designs, the two LED chips in each of the two rows closest to the first and second sides of the substrate do not have to be spaced apart from each other; rather, they can be arranged close to each other, or an additional LED chip can even be added to each of these two rows of LED chips.

Figure 5:
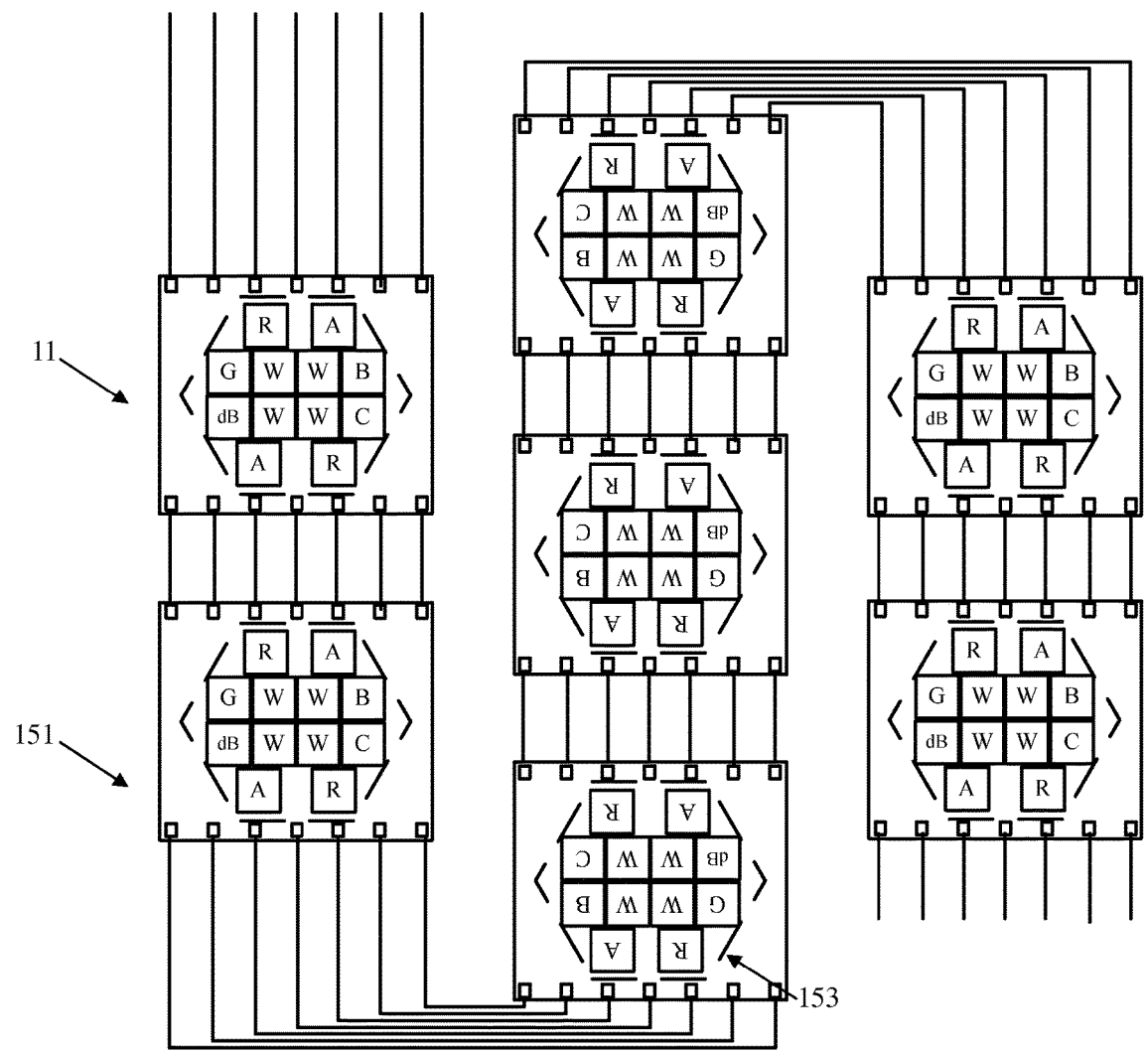
FIG. 5 schematically illustrates the structure of an array of LED unit modules in the light source system of FIG. 2.

Refer to FIG. 5, which schematically illustrates the structure of an array of LED unit modules in the light source system of FIG. 2. The LED unit module array 12 includes multiple LED unit modules. The LED unit module array 12 preferably includes at least two columns of LED unit modules 11 arranged in parallel and form an array having a round or equal-sided polygon shape, so that it can match the shape of the round lens on the optical path downstream from the LED unit module array. This enhances light utilization efficiency. Of course, if the matching with the round lens is not considered, the LED unit module array 12 does not have to have a round or equal-sided polygon shape. In this embodiment, the LED unit module array 12 includes three parallel columns of LED unit modules 11 forming an array close to an equal-sided hexagon.

In this embodiment, the multiple LED unit modules 11 in the LED unit module array 12 are identical to each other, i.e., they are identical in their spatial arrangement of the LED chips within the module, the sequence of the cathode connector set, and the spatial correspondence of the different colored LED chips with the anode and cathode connectors. Moreover, for the LED unit modules 11 in the same column, the direction pointing from the anode connector set to the cathode connector set is the same for all modules, so that the LED unit modules 11 of the same column can be connected in series. For the LED unit modules 11 in any two adjacent columns, the directions pointing from the anode connector set to the cathode connector set are the opposite, so that the two adjacent columns of LED unit modules 11 can be connected in series at the same end of the two columns.

More specifically, take the red LEDs as an example, in the first column and the third column from the left, the directions pointing from the anode connector to the cathode connector for the red LEDs are both pointing downward, while in the second column the direction pointing from the anode connector to the cathode connector for the red LEDs is pointing upward. This way, to connect all red LEDs in series, in the first and third columns the circuit serially connects the anode and cathode connectors of the red LEDs in the downward direction, in the second column the circuit serially connects the anode and cathode connectors of the red LEDs in the upward direction, and for the red LEDs in the first column and the second column, the connection is made by connecting the cathode connector of the red LED of the bottom LED unit module 151 of the first column to the anode connector of the red LED of the bottom LED unit module 153 of the second column. Other adjacent columns are connected in similar ways.

The wirings of the other six colored LEDs are the same as for the red LEDs. Because the arrangement sequences of the anode and cathode connectors in each LED unit module are the same, and because the direction pointing from the anode connector set to the cathode connector set is the opposite for adjacent columns of LED unit modules, the connector sets of adjacent columns have left-right minor symmetry; thus, the wires for serial connection of the seven colored LEDs can be adjacent to each other and parallel to each other, forming a set of wires which do not cross each other, which simplifies wiring design.

The collimating device array 2 includes multiple collimating devices 21, having a one to one correspondence with the LED unit modules 11, for collimating the light emitted by the corresponding LED unit modules. Specifically, the collimating device array 2 in this embodiment is a collimating lens array.

The fly-eye lens pair 3 includes a first fly-eye lens 31 and a second fly-eye lens 32, disposed on the output path of the collimating device array 2, for homogenizing the light beams collimated by the collimating device array 2. The first fly-eye lens 31 is disposed adjacent to the collimating device array 2. In this embodiment, each microlens of the two fly-eye lenses of the fly-eye lens pair has a shape of an equal-sided hexagon. This ensures that the microlens are closely arranged with no gap between them, and also makes the projection of the microlenses match the shape of the round shape of the projected light spot. The microlenses of the first fly-eye lens 31 correspond one to one with the microlenses of the second fly-eye lens 32. Preferably, the size of each collimating lens in the collimating device array 2 is four times or greater the size of each microlens of the fly-eye lens of the fly-eye lens pair 3. Obviously, the smaller the size of the microlens of the fly-eye lens, the better the light homogenization effect.

The focusing lens 4 is disposed on the output path of the fly-eye lens pair 3, to collect the homogenized light from the fly-eye lens pair 3 onto a predetermined plane. In practice, the predetermined plane is typically the focal plane of the focusing lens 4.

In this embodiment, the collimating lens 21, while collimating the light beam emitted from the LED unit modules 11, can also mix the light emitted by the multiple colored LEDs of the LED unit modules 11. For each LED unit module, because different colored LED chips in the LED chipset face the same collimating lens, and because the light emitted by the LEDs have a Lambertian distribution, the multiple colored light emitted by the LED chipset is collected and collimated by the collimating lens into a parallel light (although it is not an ideal parallel light, but has a divergent angle, the divergent angle is very small, such as ±9 degrees, so it can be treated as a near-parallel light), and at the same time homogenization of the light is achieved.

The different colored light beams in the parallel light beam overlap with each other in space, and their corresponding angular distributions are also similar. The light beam is then homogenized by the fly-eye lens pair 3 and focused by the focusing lens 4 onto an aperture (not shown in the drawings); and then the image of the aperture is projected by a projection lens (not shown in the drawings) to a distance. During the entire propagation of the light, the different colored light beams are always mixed together; thus, in the final output light beam of the light source system, the different colored light beams have substantially the same spatial position and output angle. Theoretically, even if the chips in the LED chipset are closely arranged, their spatial positions are still different; such differences in spatial position result in slightly different angular spatial distributions of the different colored lights from these LEDs after collimation by the collimating lens 21. However, because the size of each LED chip is very small (typically 1 mm×1 mm), and the different LED chips are disposed very close to each other, such different angular spatial distributions of the different colored lights due to difference in their spatial positions are negligible.

In this embodiment, the light from each LED unit module of the LED unit module array, after collimation, are incident on some of the microlenses of the first fly-eye lens 31. Because each such microlens will image the LED chipset of the LED unit module from which the light is received onto a microlens of the second fly-eye lens 32 that correspond to that microlens of the first fly-eye lens 31, the total area of the micolenses of the second fly-eye lens 32 where such image are formed constitutes the light emitting surface of the output light of the second fly-eye lens 32. Because the size of the light emitting surface is a constant, the smaller the divergence angle of the output light from the second fly-eye lens 32, the smaller the etendue of the output light. Based on the conservation of etendue, the larger the image formed by each microlens of the first fly-eye lens 31 on the corresponding microlens of the second fly-eye lens 32, the smaller the divergence angle of the output light of each microlens of the second fly-eye lens 32. However, when the image formed on the microlens of the second fly-eye lens 32 exceeds the size of that microlens, the extra part will become stray light and become lost. Therefore, preferably, the image of the LED chipset formed on each microlenses of the second fly-eye lens 32 is inscribed in the microlens.

In current technology, each LED unit module contains only one LED chip, which typically has a square shape. Since the microlens of the second fly-eye lens 32 is an equal-sided hexagon, the image of the square shape on the microlens cannot sufficiently fill the microlens; on the other hand, because the light emitting surface of the output light of the microlens is the entire microlens, the etendue of the LED unit module array increases. In the present embodiment, however, because the outline shape of the light emitting surface of the LED chipset in each LED unit module is close to an equal-sided hexagon, its image formed on each microlens of the second fly-eye lens 32 can approximately fill the entire microlens, which prevents significant increase of the etendue of the LED unit module array. In some situations, to make the outline shape of the light emitting surface of the LED chipset fill the microlens even fuller, the outline shape of the light emitting surface of the LED chipset can be made to go beyond the equal-sided hexagon; as long as the area of the part that goes beyond the equal-sided hexagon is less than 30% of the size of the outline shape of the light emitting surface, it is acceptable.

Figure 6:
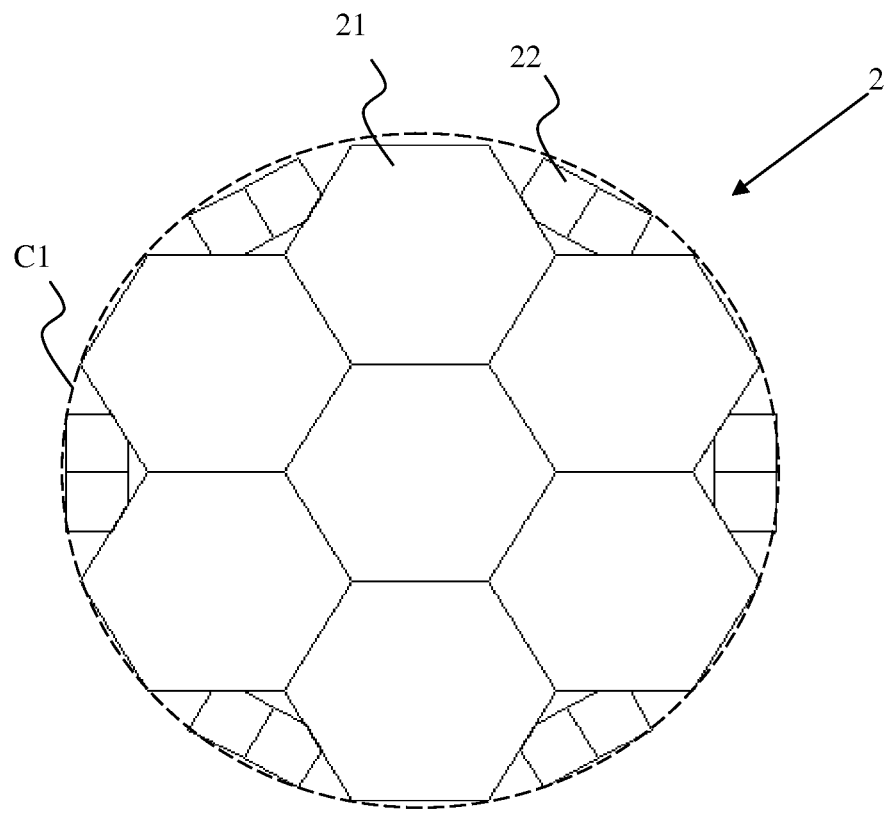
FIG. 6 schematically illustrates the arrangement of a collimating lens array in the light source system of FIG. 2.

Refer to FIG. 6, which schematically illustrates the arrangement of the collimating lens array in the light source system of FIG. 2. In this embodiment, each collimating lens 21 in the collimating device array 2 is preferably shaped as an equal-sided hexagon, and they are arranged close to each other without any gaps between adjacent collimating lenses 21. This way, the light emitted by the same colored LED chips in each LED unit module is connected together when they are collimated and outputted from the multiple collimating lenses 21, and these collimated light beams are connected together when they are projected from the projection lens, filling the entire light emitting surface. Of course, due to tolerance and assembly considerations, adjacent collimating lenses may have gaps between them, which is still within the scope of the present invention. Because the collimating device array 2 still has some remaining unfilled areas as compared to the circle C1 for which it is an inscribed shape, to make the light emitting surface of the collimating device array 2 closer to a round shape, so as to match better with the round lens in the downstream optics, the collimating device array 2 preferable further includes multiple smaller collimating lenses 22, located in the unfilled areas. Correspondingly, the light emitting device 1 may further include multiple LEDs packaged with a single chip or two chips (not shown in the drawings), and such LEDs correspond one to one with the smaller collimating lenses 22. This way, the light emitted by the light emitting device 1, after collimation by the collimating device array 2, has a cross-section that is closer to a round shape.

In this embodiment, to further improve the spatial distribution uniformity of the projected light spot, a light integration rod (not shown in the drawings) may be provided between the LED unit modules 11 and the collimating device 21 to homogenize the output light beam from the LED chip. The light integration rod has a light entrance port and a light exit port. The light entrance port is disposed close to the light emitting surface of the LED chip of the LED unit module, so that almost all light emitted from the LED can enter the light integration rod. The light exit port is disposed close to the focal plane of the collimating device 21, so that the light beam from the exit port can be collimated by the collimating lens 21 into a near parallel light. In this case, the light exit port of the light integration rod constitutes the light source surface of the system. Because of the light mixing effect of the light integration rod, the light generated by the LED light source system is more uniform.

In practical applications, the light integration rod may be a cone shaped square rod where the light exit port is larger than the light entrance port. When the light exit port of the cone shaped square rod is sufficiently large, such that the exit ports of adjacent rods merge into one piece, the light outputted from the exit ports of the cone shaped square rods will also merge into one beam. Because the light output from the cone shaped square rod has reduced divergence angles, the collimating lenses may be omitted; i.e., the light integration rod functions as a collimating device. However, in such a case, to achieve satisfactory light mixing, the cone shaped square rod should have a sufficiently length.

To make the mixed light spot formed on the predetermined plane by the multiple colored light from LED unit module array more uniform, the different colored LED chips in different LED unit modules can be spatially arranged such that, at least for any one color other than white, the LED chips are approximately evenly distributed among the various position in the LED unit module.

In a specific example, the different LED unit modules are rotated by different angles in the light emitting surface before they are mounted. Preferably, each LED unit module may be rotated around its center by an angle which is 1, 2, 3, 4, 5, or 6 times 60 degrees, as detailed below.

Differences between this embodiment and the embodiment of FIG. 5 include:

In this embodiment, the LED unit module array includes seven LED unit modules, where six of them are distributed on a circle and one of them is located at the center of the circle.

On the circle, in the first LED unit module, the direction that points from its anode connector set to its cathode connector set is horizontal and point to the left. Starting from this first LED unit module, in the counter-clockwise direction of the circle, each next LED unit module is rotated counter-clockwise by 60 degrees as compared to the previous LED unit module.

In this embodiment, for wiring, the positive terminal of the power source is connected to the anode connector set of the first LED unit module on the circle. The LED unit modules on the circle are connected in series along the counter-clockwise direction. The cathode connector set of the last LED unit module on the circle is connected to the anode connector set of the LED unit module located at the center of the circle, and the cathode connector set of that LED unit module is connected by jumpers to the negative terminal of the power source which is located outside of the circle.

In this embodiment, the LED unit modules on each circle are rotated by different angles, and these rotation angles are evenly distributed between 0-360 degrees. This way, for each color LED except for white in the LED unit module, the LED appears twice at each of 0 degree, 60 degrees, 120 degrees, 180 degrees, 240 degrees and 300 degrees locations of the equal-sided hexagon of the unit module. This way, LED chips of each color are approximately evenly distributed among the various position in the LED unit module. Meanwhile, wiring is simple and convenient because for any two adjacent LED unit modules on the circle, the anode connector set of one and the cathode connector set of the other are adjacent to each other, and as a result few wire intersections are formed.

Further, in this embodiment, each LED unit module on the circle is rotated by an angle that is a multiple of 60 degrees, and because the LED chipset arrangement in each LED unit module is closed to an equal-sided hexagon, after the 60 degree rotation, the shape remains the same. The orientations of the microlenses in the second fly-eye lens of the fly-eye lens pair are the same; although in this embodiment the LED unit modules on the circle are rotated, the image of the LED chipsets in each LED unit module formed on each microlens of the second fly-eye lens of the fly-eye lens pair can still match the microlens after the rotation. Therefore, in a LED unit module array formed by at least two concentric circles, on each circle in the counter-clockwise direction, the rotation angles of the LED unit modules preferably form an arithmetic series, and the common difference of the arithmetic series has an absolute value of 60 degrees. This way, the image formed by each LED unit module on the microlenses of the second fly-eye lens can match the shape of the microlenses.

In the above embodiments, the LED chips of each color are single LED chips. In practice, LED chips of at least one of the colors may be compound-color LED chips, including two LED chips of different dominant wavelengths, the difference between the two dominant wavelengths being between 10 nm and 30 nm. For this types of LED chips with two dominant wavelengths, human eyes can differentiate the color difference, but the color difference is not very conspicuous to human eyes.

From the above descriptions, it can be seen that the embodiments of the present invention can achieve an LED light source systems that generates uniform colors. The inventors discovered through experimentation that because the light generated by the LED light source system is sufficiently uniform, even when compound-color LED chips are used, human eyes cannot detect the effect due to the color difference of the compound-color LED chips. Meanwhile, using compound-color LED chips can expand the spectral coverage of the LED light source system and improve its color rendering index.

Preferably, the LED light source system further includes a color adjustment module, which receives color adjustment signals corresponding to the compound-color LED chips, and based on the target color information contained in the color adjustment signals, adjusts the light emitting powers of the LED chips of the two dominant wavelengths in the compound-color LED chips. For example, for red color, red LED chips of 618 nm and 635 nm can be used. These two colors are different but the difference is not conspicuous. This way, the relative intensities of the two red lights can be adjusted using the color adjustment module, so that a red projection light beam of different dominant wavelengths can be generated.

On the other hand, the LED unit modules that contain the LED chips of the two different dominant wavelengths corresponding to compound-color LED chips can be arranged in an interleaved manner, so that the lights of these two dominant wavelengths are mixed more uniformly, and the color difference is even more inconspicuous to human eyes.

In this embodiment, white LED chips of different color temperatures can be used, for example, color temperatures of 3200 K and 6500 K. The LED unit modules containing such LEDs chips of two different color temperatures are arranged in an interleaved manner, to ensure uniform light mixing. Further, by adjusting the relative intensities of such two LED unit modules using the adjustment module, projection light beams of different color temperatures can be generated. This is generally known to those skilled in the relevant art and is not described in further detail.

In this disclosure, the various embodiments are described in a progressive manner, where each embodiment is described in terms of their differences from other embodiment; the common or similar features of the various embodiments can be understood by referring to each other.

Embodiments of the present invention also provide a projection system, including a light source system which has the structures and functions of the light source system of the above described embodiments. The projection system may employ various projection technologies, such as liquid crystal display (LCD) projection technology, digital light processor (DLP) projection technology, etc. Further, the above described light emitting devices can also be used in illumination systems, such as stage lighting.

The above descriptions disclose the embodiments of the present invention, but do not limit the scope of the invention. Thus, it is intended that the present invention cover modifications and variations that come within the scope of the appended claims and their equivalents, as well as direct or indirect applications of the embodiments in other related technical fields.

What is claimed is:

1. A LED unit module, comprising:
a substrate, and an LED chipset disposed on the substrate, wherein the LED chipset consists of four white or yellow LEDs, two red LEDs, two amber LEDs, one blue LED, one deep blue LED, one green LED and one cyan LED which are arranged close to each other, and wherein a light emitting surface of the LED chipset has an outline shape that is substantially an equal-sided hexagon.

2. The LED unit module of claim 1, wherein same color LEDs are disposed symmetrically with respect to a center of the equal-sided hexagon, wherein the blue LED and the deep blue LED are disposed symmetrically with respect to the center of the equal-sided hexagon, and the green LED and the cyan LED are disposed symmetrically with respect to a center of the equal-sided hexagon.

3. The LED unit module of claim 1, wherein the four white or yellow LEDs are arranged close to each other forming a rectangular array, and the remaining eight LEDs surround the rectangular array, where each two LEDs are disposed in parallel and close to two white or yellow LEDs on each side of the rectangular array.

4. A light emitting device, comprising an array of a plurality of LED unit modules according to claim 1.

5. The light emitting device of claim 4, wherein the array of LED unit modules form at least one concentric circle, wherein within each circle, in the counter-clockwise direction, rotation angles of the LED unit modules form an arithmetic series, and a common difference of the arithmetic series has an absolute value of 60 degrees.

6. A light source system, comprising:
the light emitting device according to claim 4;
a collimating unit array, wherein each collimating unit in the collimating unit array corresponds to an LED unit module of the array of LED unit modules, for collimating light emitted by the corresponding LED unit module;
a fly-eye lens pair, including two fly-eye lenses, for homogenizing light from the collimating unit array, wherein each microlens of the fly-eye lens disposed farther away from the collimating unit array is an equal-sided hexagon;
a focusing lens, for concentrating light from the fly-eye lens pair onto a predetermined plane.

7. The light source system of claim 6, wherein the collimating unit array is an array of collimating lenses, each collimating lens being an equal-sided hexagon, and wherein the collimating lenses are disposed close to each other and joined to each other.

8. A LED unit module, comprising:
a substrate, and an LED chipset disposed on the substrate, wherein the LED chipset consists of twelve LED chips and an anode connector and a cathode connector for each LED chip, four of the LED chips being arranged close to each other forming a rectangular array, and the remaining eight LED chips surrounding the rectangular array, wherein each two LED chips are disposed in parallel and close to two LED chips on each side of the rectangular array, and wherein a light emitting surface of the LED chipset has an outline shape that is substantially an equal-sided hexagon, and wherein the twelve LED chips include at least four colors, the four colors being red, blue, green and amber.

9. The LED unit module of claim 8, wherein the anode connectors of all LED chips are arranged along a first side of the substrate forming an anode connector set, and the cathode connectors of all LED chips are arranged along a second side of the substrate forming a cathode connector set;
wherein among the eight surrounding LED chips of the LED unit module, in each of the two rows of LED chips that are respectively closest to the first and second sides of the substrate, the two LED chips in the row are separated by a predetermined separation space, wherein wirings that connect the LED chips in the rectangular array with the corresponding anode connectors and cathode connectors are located on the surface of the substrate within the separation space.

10. The LED unit module of claim 9, wherein each of the two rows of LED chips includes a red LED and an amber LED.

11. A light emitting device, comprising an array of a plurality of LED unit modules according to claim 8.

12. The light emitting device of claim 11, wherein the array of LED unit modules form at least one concentric circle, wherein within each circle, in the counter-clockwise direction, rotation angles of the LED unit modules form an arithmetic series, and a common difference of the arithmetic series has an absolute value of 60 degrees.

13. A light source system, comprising:
the light emitting device according to claim 11;
a collimating unit array, wherein each collimating unit in the collimating unit array corresponds to an LED unit module of the array of LED unit modules, for collimating light emitted by the corresponding LED unit module;
a fly-eye lens pair, including two fly-eye lenses, for homogenizing light from the collimating unit array, wherein each microlens of the fly-eye lens disposed farther away from the collimating unit array is an equal-sided hexagon;
a focusing lens, for concentrating light from the fly-eye lens pair onto a predetermined plane.

14. The light source system of claim 13, wherein the collimating unit array is an array of collimating lenses, each collimating lens being an equal-sided hexagon, and wherein the collimating lenses are disposed close to each other and joined to each other.

15. The LED unit module of claim 8, wherein the twelve LED chips further include at least one color selected from cyan, deep blue, orange white and yellow.

* * * * *